US009660572B2

(12) United States Patent
Hsu

(10) Patent No.: US 9,660,572 B2
(45) Date of Patent: May 23, 2017

(54) ALUMINUM FRAME STRUCTURE FOR PACKAGING SOLAR PANEL

(71) Applicant: Eterbright Solar Corporation, Miaoli County (TW)

(72) Inventor: Chien-Chung Hsu, Miaoli County (TW)

(73) Assignee: ETERBRIGHT SOLAR CORPORATION, Miaoli County (TW)

( * ) Notice: Subject to any disclaimer, the term of this patent is extended or adjusted under 35 U.S.C. 154(b) by 0 days.

(21) Appl. No.: 14/450,761

(22) Filed: Aug. 4, 2014

(65) Prior Publication Data

US 2015/0090678 A1   Apr. 2, 2015

(30) Foreign Application Priority Data

Oct. 1, 2013   (TW) .............................. 102218344 U

(51) Int. Cl.
*H02S 30/10* (2014.01)
*H01L 31/048* (2014.01)
*F24J 2/46* (2006.01)

(52) U.S. Cl.
CPC ............ *H02S 30/10* (2014.12); *H01L 31/048* (2013.01); *H01L 31/0481* (2013.01); *F24J 2/4645* (2013.01); *Y02E 10/50* (2013.01)

(58) Field of Classification Search
CPC ... H02S 30/10; H01L 31/048; H01L 31/0481; F24J 2/4645; Y02E 10/50
USPC ........................ 126/710; 52/800.12; 428/598
See application file for complete search history.

(56) References Cited

U.S. PATENT DOCUMENTS

| | | | | |
|---|---|---|---|---|
| 3,190,408 A | * | 6/1965 | Petterson | B62D 27/026 114/88 |
| 3,349,533 A | * | 10/1967 | Gregoire | E04B 2/7854 52/282.2 |
| 3,416,282 A | * | 12/1968 | Daugherty | A47B 95/04 428/122 |
| 5,022,930 A | * | 6/1991 | Ackerman | H01L 31/0392 136/251 |
| 5,478,402 A | * | 12/1995 | Hanoka | B32B 17/10036 136/251 |
| 8,893,419 B2 | * | 11/2014 | Huang | H02S 20/00 136/251 |
| 2009/0165843 A1 | * | 7/2009 | Horioka | F24J 2/4612 136/251 |

(Continued)

*Primary Examiner* — Michael Safavi
(74) *Attorney, Agent, or Firm* — WPAT, PC; Justin King; Jonathan Chiang

(57) ABSTRACT

An aluminum frame structure for packaging solar panel, comprising: a vertical support member; an U-shaped member, coupled to the vertical support member while allowing the opening of the U-shaped member to face toward a level direction; and at least one protruding member, disposed inside the U-shaped member, each having at least one protrusion arranged at the opening of the U-shaped member and at a position neighboring to the vertical support member while allowing the gap between the highest point of the at least one protrusion and an imaginary line representing the contact slope to be formed larger than the thickness of the back film, and also enabling the contact area of the at least one protrusion and the contact slope to be at least larger than 50% of the area of the contact slope.

8 Claims, 10 Drawing Sheets

(56) References Cited

U.S. PATENT DOCUMENTS

| | | | | |
|---|---|---|---|---|
| 2010/0263724 A1* | 10/2010 | Tazawa | ............... | F24J 2/5211 136/259 |
| 2010/0266800 A1* | 10/2010 | Dutsch | ............... | E06B 3/5454 428/40.4 |
| 2014/0014166 A1* | 1/2014 | Endou | ............... | H01L 31/0424 136/251 |
| 2014/0048498 A1* | 2/2014 | Kuan | ............... | F24J 2/5211 211/41.1 |

* cited by examiner

ALUMINUM FRAME STRUCTURE FOR PACKAGING SOLAR PANEL

FIELD OF THE INVENTION

The present invention relates to solar cell technology, and more particularly, to an aluminum frame structure for packaging solar panel.

BACKGROUND OF THE INVENTION

While operating in a high-temperature environment, generally the filling material used for packaging solar panels inside its aluminum frame may be softened for causing the solar panels to be brought to slip and move inside the aluminum frame by gravity, causing the filling materials to be squeezed and thus overflowed out of the aluminum frame.

Conventionally, the aforesaid slipping of solar panels inside its aluminum frame is prevented by the design of the aluminum frame for enabling the aluminum frame to press tightly onto the solar panels. However, no matter how tight the aluminum frame is pressed on the solar panels, such slipping will happen eventually after being used for a long period of time, which not only can be hazardous, but also can cause the power conversion efficiency of the solar cell device to drop substantially.

Therefore, it is in need of an improved aluminum frame structure for packaging solar panels.

SUMMARY OF THE INVENTION

The present invention relates to an aluminum frame structure for packaging solar panels, in which the solar panels are fixed securely inside an aluminum frame by protruding members, and thus the conventional hazard of panel slipping and degrading power conversion efficiency can be avoided by this simple structural improvement.

The primary object of the invention an aluminum frame structure for packaging solar panel, that is, a solar panel, being framed inside an aluminum frame structure, is substantially a lamination of glass covers and solar cell glasses that and packaged by a packaging material in a manner that the packaging material is to form a contact slop around the periphery of lamination of glass covers and solar cell glasses, and when ethylene vinyl acetate (EVA) and a back film is used as the filling material, the EVA is filled and sandwiched between glass covers and solar cell glasses while allowing the contact slope and the glass covers to be sealed by the back film. Thus, the aluminum frame structure of the invention comprises: a vertical support member; an U-shaped member, coupled to the vertical support member while allowing the opening of the U-shaped member to face toward a level direction; and at least one protruding member, disposed inside the U-shaped member, each having at least one protrusion arranged at the opening of the U-shaped member and at a position neighboring to the vertical support member while allowing the gap between the highest point of the at least one protrusion and an imaginary line representing the contact slope to be formed larger than the thickness of the back film, and also enabling the contact area of the at least one protrusion and the contact slope to be at least larger than 50% of the area of the contact slope.

In an exemplary embodiment, the U-shaped member has a Butyl filling material filled therein.

In an exemplary embodiment, there are two protruding members disposed inside the U-shaped member.

In an exemplary embodiment, there are a plurality of protruding members disposed alternatively inside the U-shaped member.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
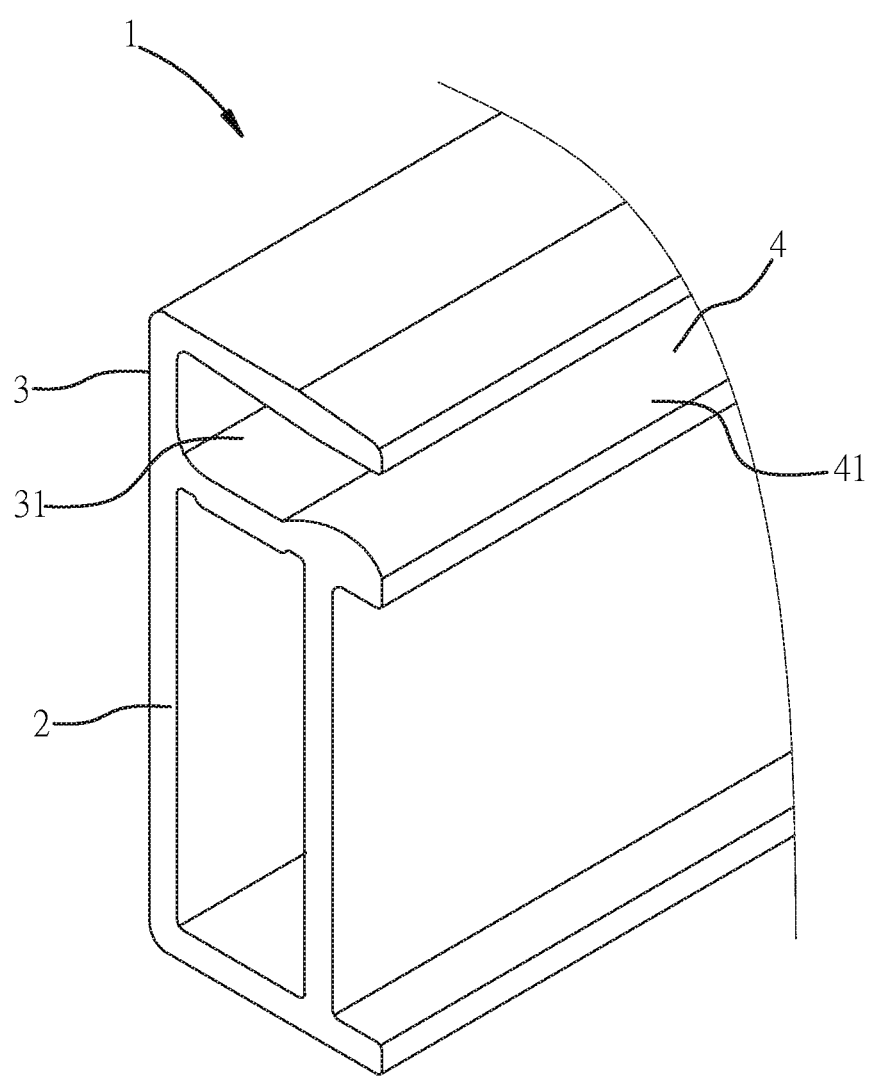
FIG. 1 is a three-dimensional diagram showing an aluminum frame structure for packaging solar panels according to a first embodiment of the present invention.
Figure 2:
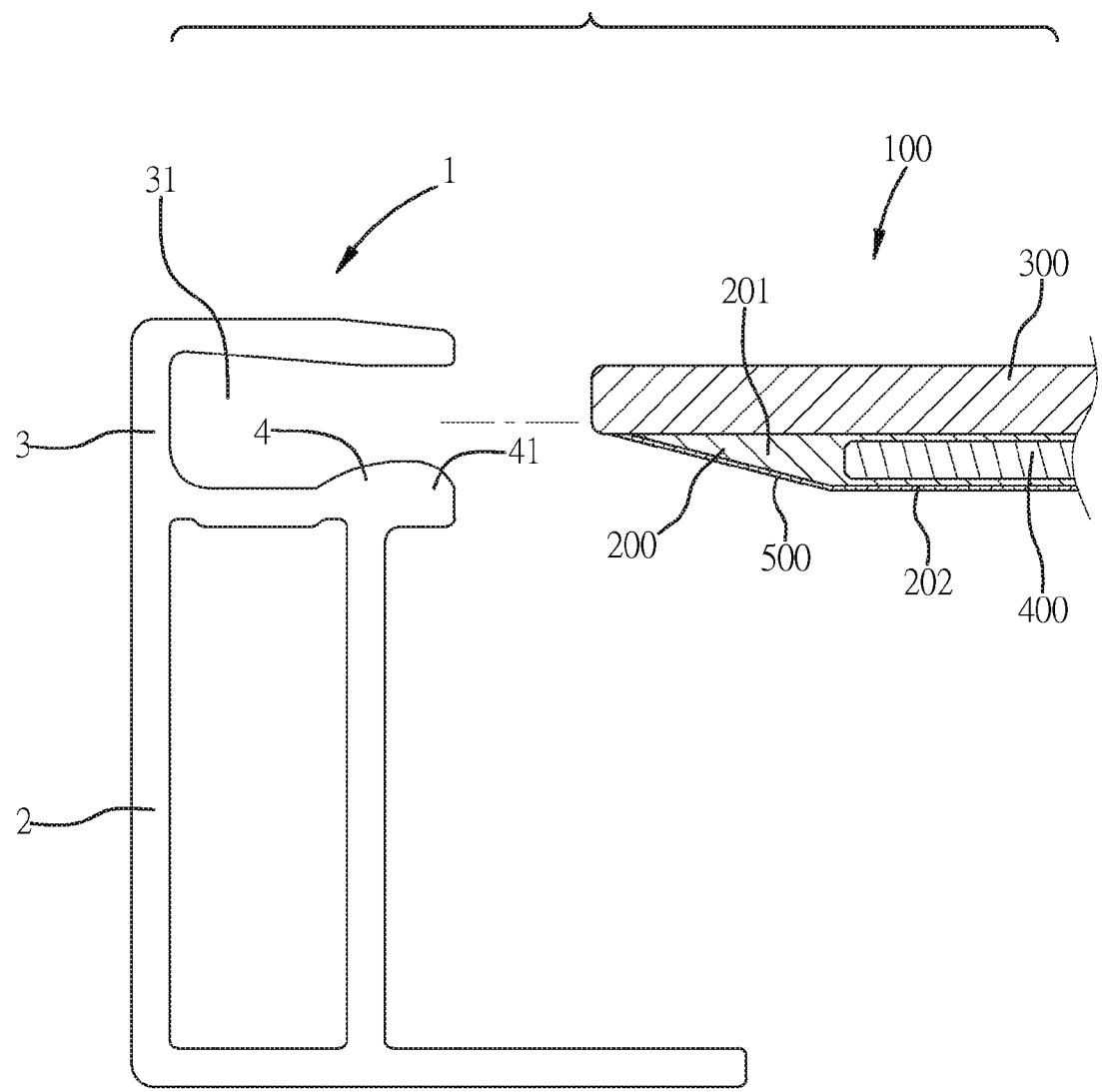
FIG. 2 is a sectional view of an aluminum frame structure for packaging solar panels before assembling according to the first embodiment of the present invention.
Figure 3:
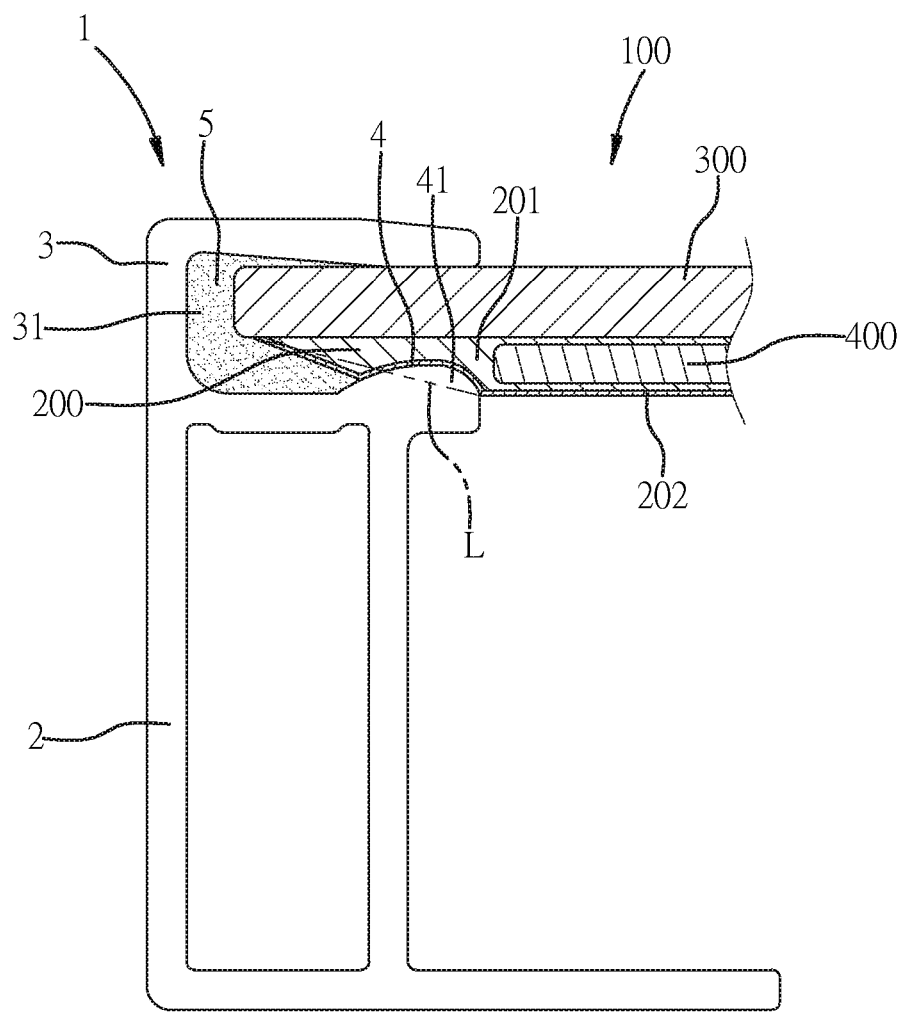
FIG. 3 is a sectional view of an aluminum frame structure for packaging solar panels after assembling according to the first embodiment of the present invention.
Figure 4:
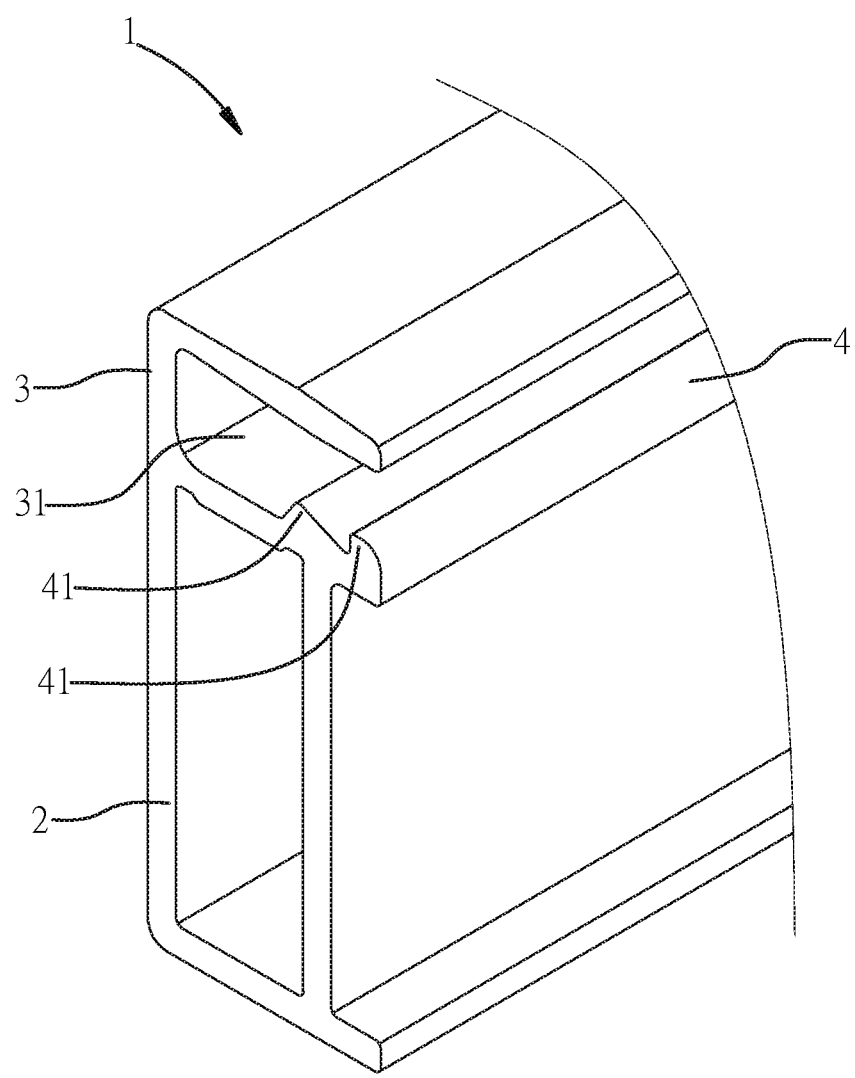
FIG. 4 is a three-dimensional diagram showing an aluminum frame structure for packaging solar panels according to a second embodiment of the present invention.
Figure 5:
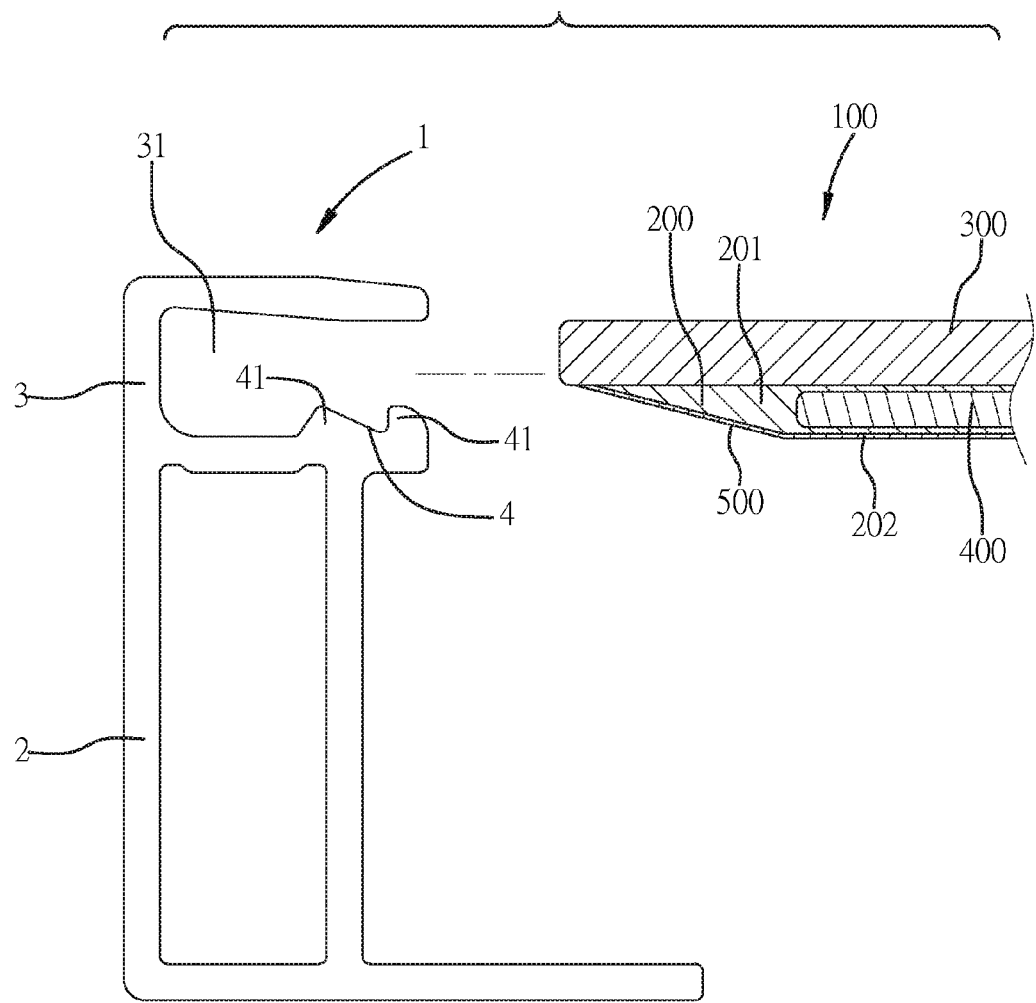
FIG. 5 is a sectional view of an aluminum frame structure for packaging solar panels before assembling according to the second embodiment of the present invention.
Figure 6:
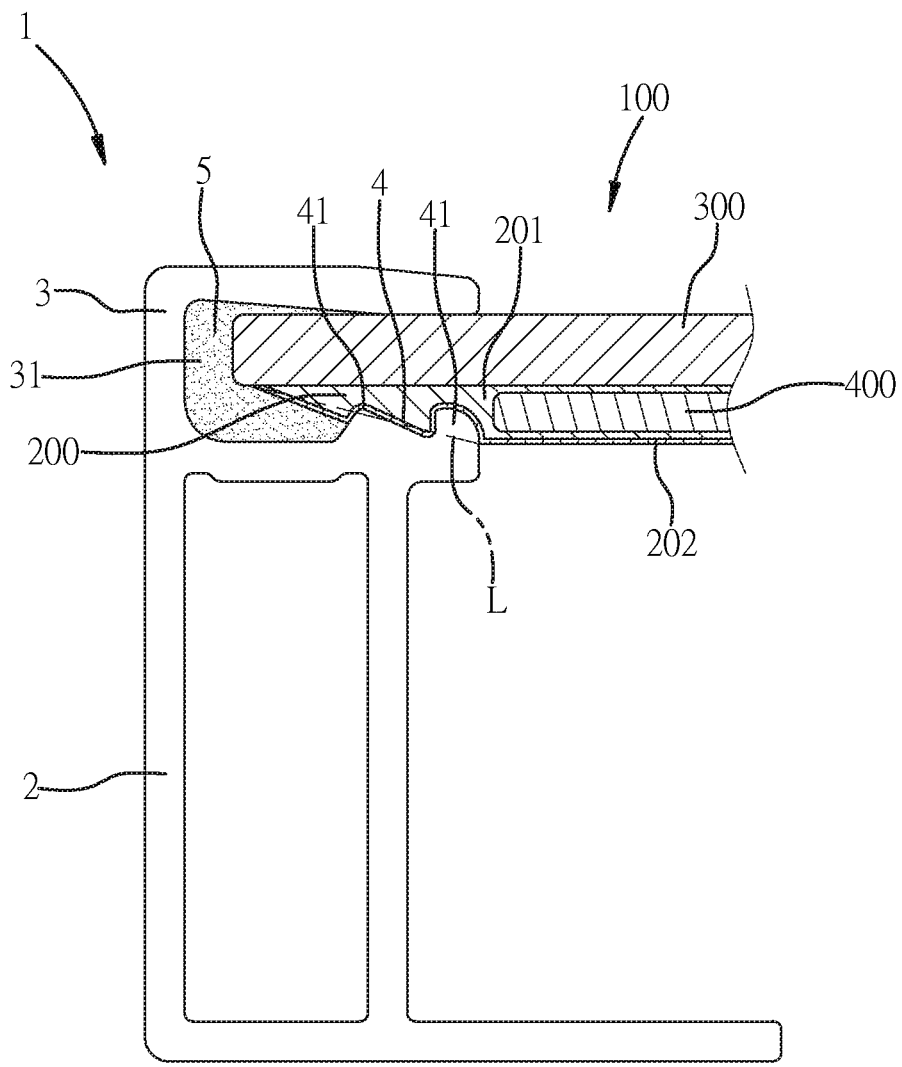
FIG. 6 is a sectional view of an aluminum frame structure for packaging solar panels after assembling according to the second embodiment of the present invention.
Figure 7:
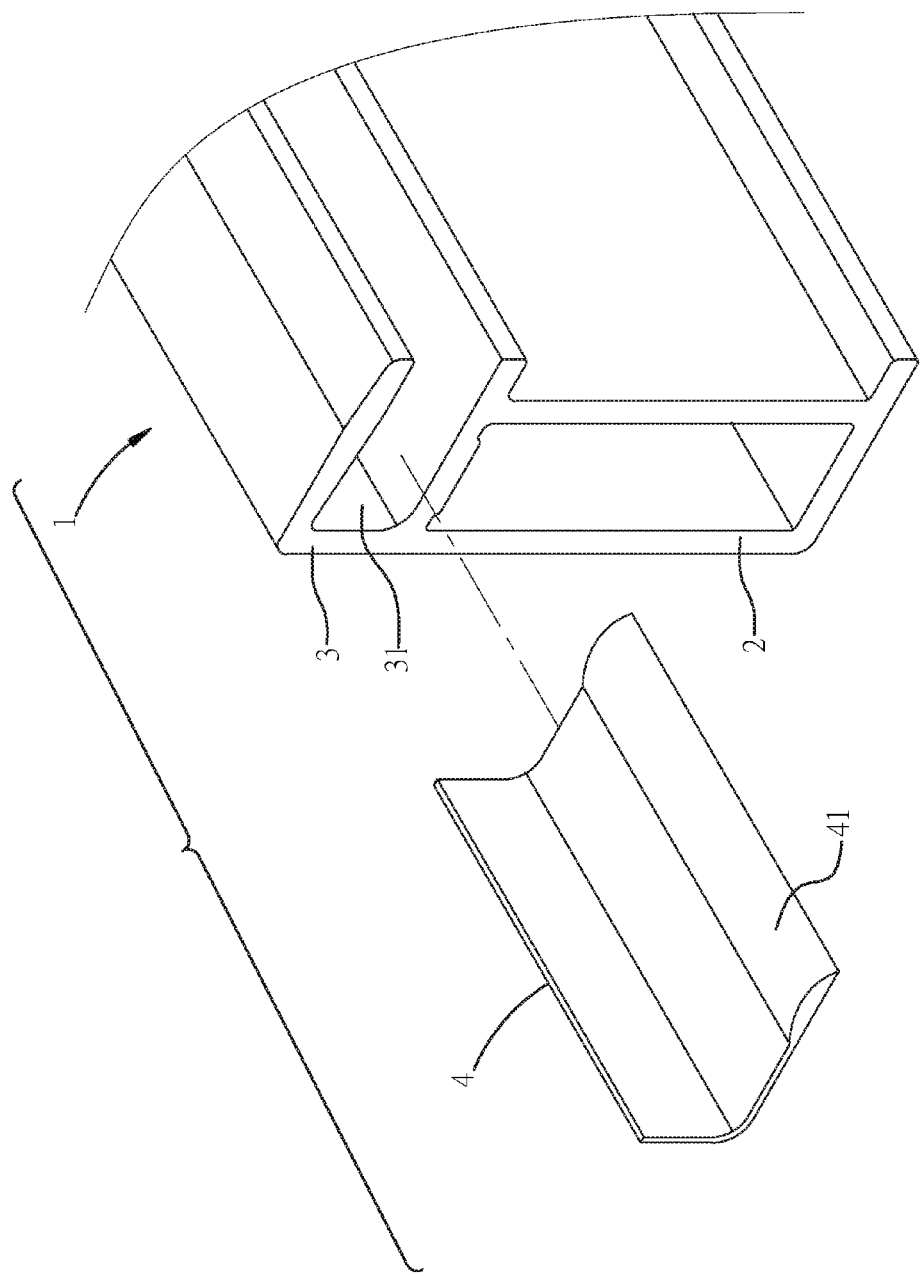
FIG. 7 is an exploded view of an aluminum frame structure for packaging solar panels according to a third embodiment of the present invention.
Figure 8:
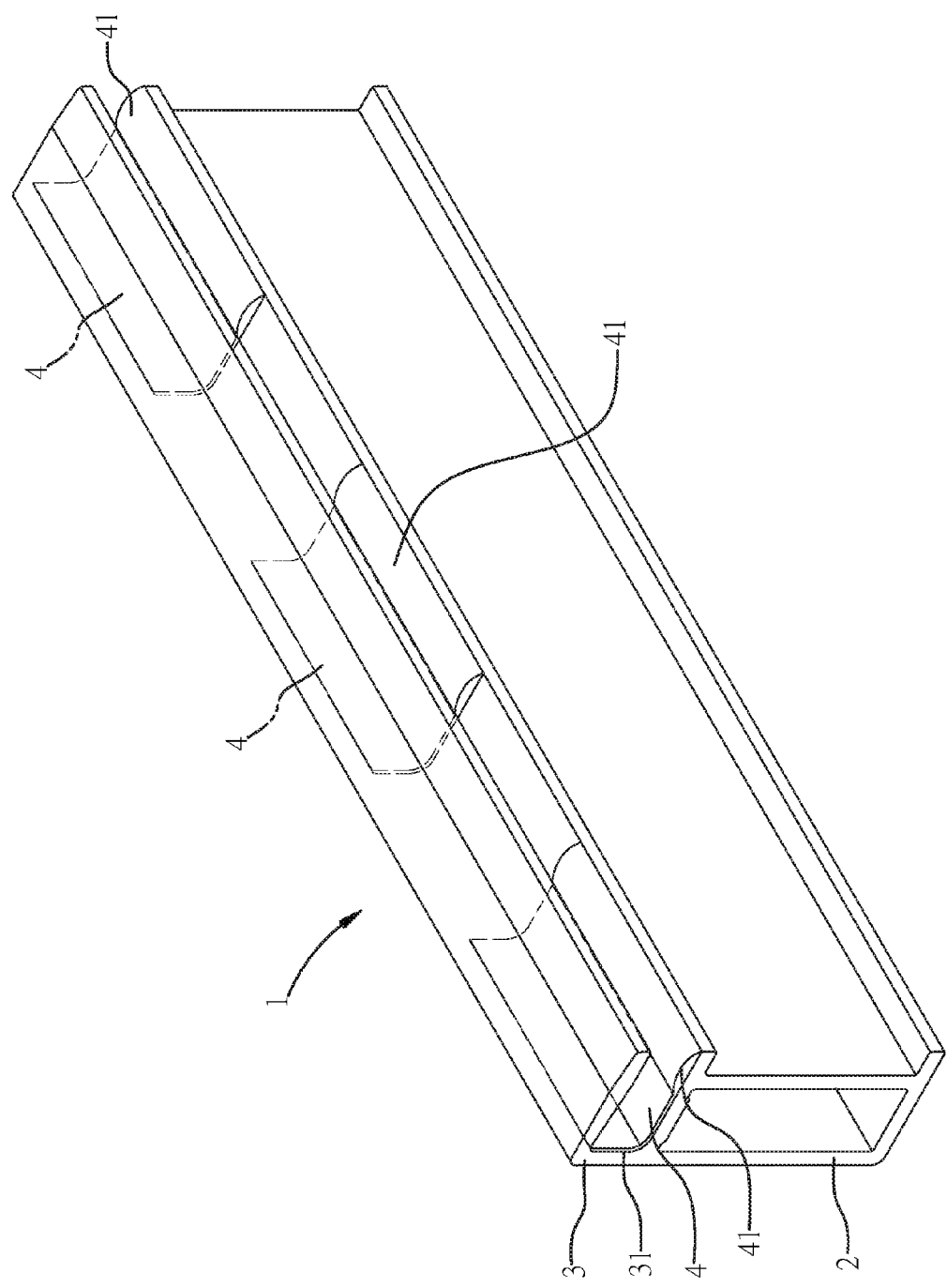
FIG. 8 is a three-dimensional diagram showing an aluminum frame structure for packaging solar panels according to the third embodiment of the present invention.
Figure 9:
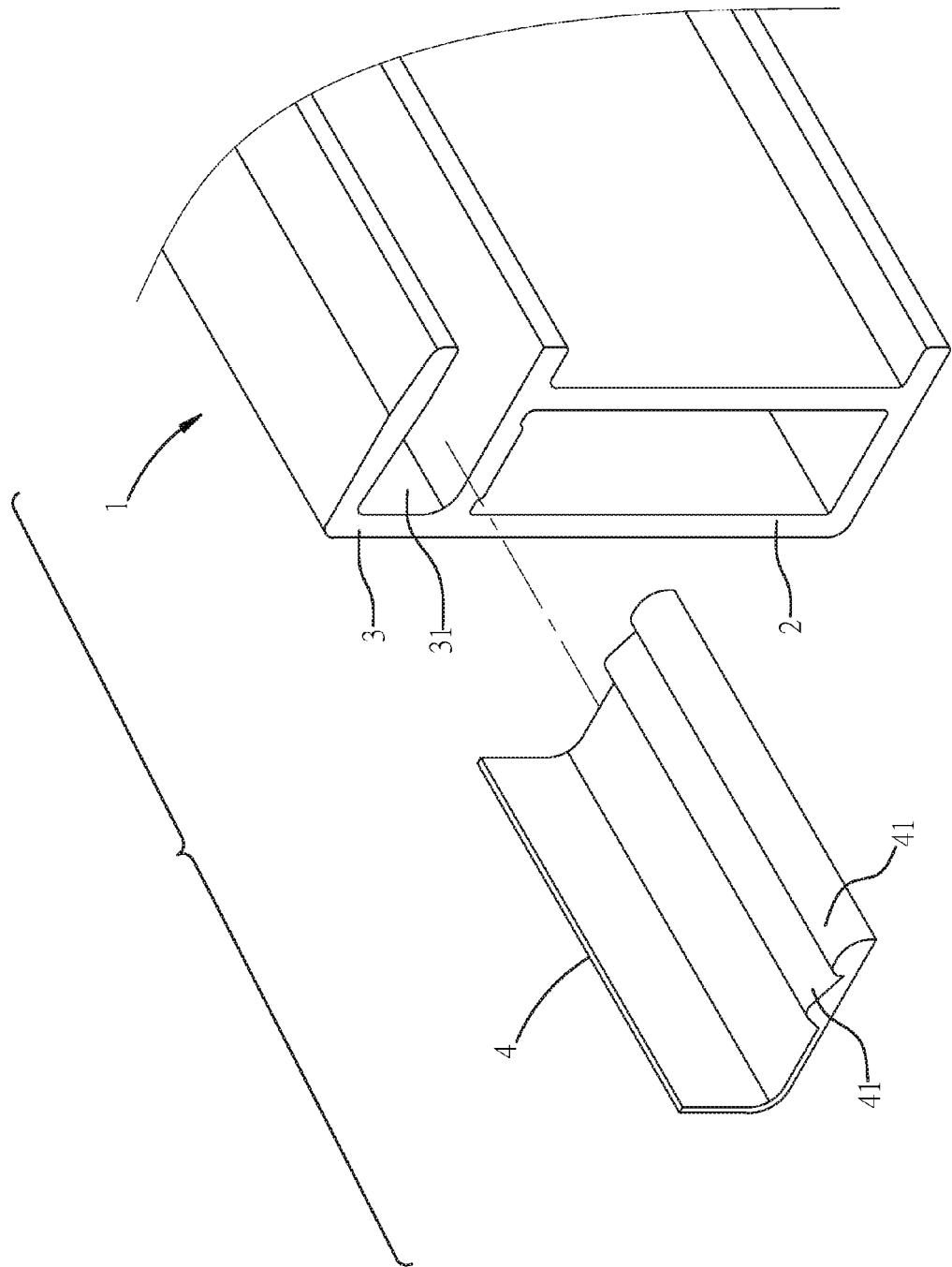
FIG. 9 is an exploded view of an aluminum frame structure for packaging solar panels according to a fourth embodiment of the present invention.
Figure 10:
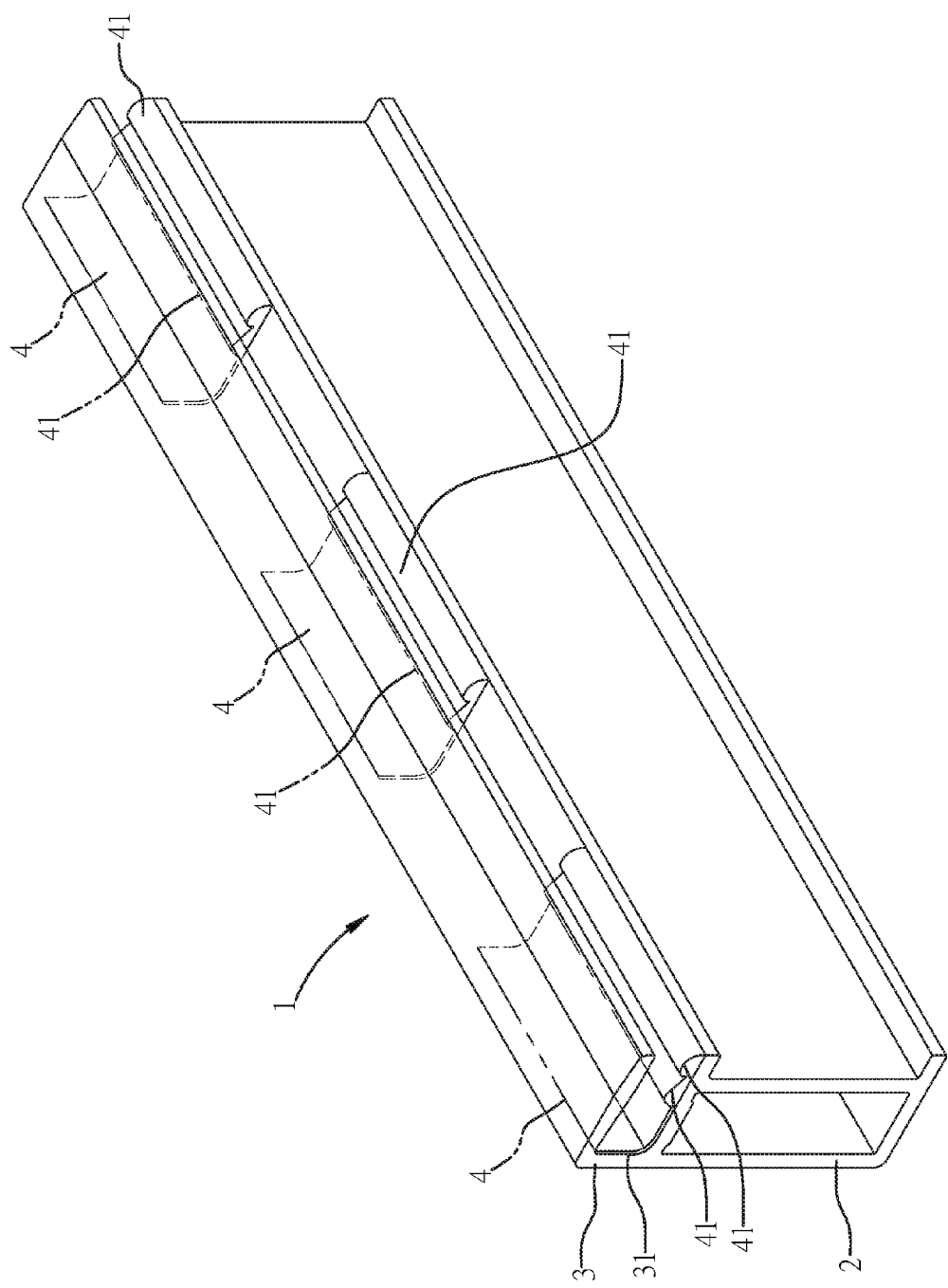
FIG. 10 is a three-dimensional diagram showing an aluminum frame structure for packaging solar panels according to the fourth embodiment of the present invention.

As an aluminum frame structure 1 shown in FIG. 1, a solar panel 100, being framed inside the aluminum frame structure 1, is substantially a lamination of a glass cover 300 and a solar cell glass 400 that and packaged by a packaging material 200 in a manner that the packaging material 200 is to form a contact slope 500 around the periphery of lamination of the glass cover 300 and solar cell glass 400, and when ethylene vinyl acetate (EVA) 201 and a back film 202 is used as the filling material, the EVA 201 is filled and sandwiched between glass cover 300 and solar cell glass 400 while allowing the contact slope 500 and the glass cover 300 to be sealed by the back film 202.

Moreover, the aluminum frame structure 1 of the invention comprises: a vertical support member 2; an U-shaped member 3, coupled to the vertical support member 2 while allowing the opening 31 of the U-shaped member 3 to face toward a level direction; and at least one protruding member 4, disposed inside the U-shaped member 3. In this embodiment, the U-shaped member 3 has a Butyl filling material 5 filled therein.

In addition, there can be only one such protruding member 4 disposed inside the U-shaped member 3 that is integrally formed with the U-shaped member 3, as those shown in FIG. 1 to FIG. 6; or there can be a plurality of such protruding members 4 alternatively disposed inside the U-shaped member 3, as those shown in FIG. 7 to FIG. 10. However, the above description is only for illustration, and thus the present invention is not limited thereby. In another embodiments, each protruding member 4 can be formed with at least one protrusion 41. For instance, there are one protrusion 41 for each protruding member 4, as those shown in FIG. 3~FIG. 3, FIG. 7 and FIG. 8; and there are two protrusions 41 for each protruding member 4, as those shown in FIG. 4~FIG. 6, FIG. 9 and FIG. 10, but also the present invention is not limited thereby. Each such protrusion 41 is arranged at the opening 31 of the U-shaped member 3 and at a position neighboring to the vertical support member 2 while allowing the gap between the highest point of the protrusion 41 and an imaginary line L representing the contact slope 500 to be formed larger than the thickness of the back film 202, and also enabling the contact area of the protrusion 41 and the contact slope 500 to be at least larger than 50% of the area of the contact slope. Thereby, the degree of rigidity for the solar panel 100 can be enhanced.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. An aluminum frame structure and solar panel packaging assembly, comprising:
a solar panel, comprising a lamination of glass covers and solar cell glasses packaged by a packaging material, wherein the packaging material forms a contact slope around the periphery of the lamination of glass covers and solar cell glasses, and when ethylene vinyl acetate (EVA) and a back film is used as a filling material, the EVA is filled and sandwiched between the glass covers and the solar cell glasses while allowing the contact slope and the glass covers to be sealed by the back film; and an the aluminum frame structure, comprising:
a vertical support member;
an U-shaped member, coupled to the vertical support member while allowing an opening of the U-shaped member to face toward a horizontal direction; and
at least one protruding member, disposed inside the U-shaped member and integrally formed with said U-shaped member, said at least one protruding member having at least one protrusion arranged at the opening of the U-shaped member and at a position neighboring the vertical support member, and also having a contact area of the at least one protrusion and the contact slope that is at least larger than 50% of an area of the contact slope;

wherein, the solar panel is framed inside the U-shaped member of the aluminum frame structure.

2. The aluminum frame structure and solar panel packaging assembly of claim 1, wherein the U-shaped member has a butyl filling material filled therein.

3. The aluminum frame structure and solar panel packaging assembly of claim 1, wherein there are two protruding members disposed inside the U-shaped member.

4. The aluminum frame structure and solar panel packaging assembly of claim 2, wherein there are two protruding members disposed inside the U-shaped member.

5. The aluminum frame structure and solar panel packaging assembly of claim 1, wherein there are a plurality of protruding members disposed inside the U-shaped member.

6. The aluminum frame structure and solar panel packaging assembly of claim 2, wherein there are a plurality of protruding members disposed inside the U-shaped member.

7. The aluminum frame structure and solar panel packaging assembly of claim 3, wherein there are a plurality of protruding members disposed inside the U-shaped member.

8. The aluminum frame structure and solar panel packaging assembly of claim 4, wherein there are a plurality of protruding members disposed inside the U-shaped member.

* * * * *